United States Patent [19]

Sugitani

[11] Patent Number: 4,493,007
[45] Date of Patent: Jan. 8, 1985

[54] NOISE ELIMINATOR

[75] Inventor: Masami Sugitani, Imadate, Japan

[73] Assignee: Murata Manufacturing Co., Ltd., Nagaokakyo, Japan

[21] Appl. No.: 537,043

[22] Filed: Sep. 29, 1983

[30] Foreign Application Priority Data

Oct. 1, 1982 [JP] Japan .......................... 57-149866[U]

[51] Int. Cl.³ .......................... H01G 1/14; H01R 13/38
[52] U.S. Cl. .............................. 361/307; 339/143 R; 455/222
[58] Field of Search ................. 361/306, 307; 455/222, 455/223; 367/901; 375/58; 339/14 R, 14 L, 143, 103 M

[56] References Cited

U.S. PATENT DOCUMENTS

| 2,785,298 | 3/1957 | Menhennett | 455/222 X |
| 3,912,354 | 10/1975 | Campbell et al. | 339/143 R X |
| 4,130,334 | 12/1978 | Anderson | 339/14 R X |
| 4,232,929 | 11/1980 | Zobawa | 339/14 R X |

Primary Examiner—Donald A. Griffin
Attorney, Agent, or Firm—Wenderoth, Lind & Ponack

[57] ABSTRACT

A noise eliminator mounted from the exterior to a flat cable connecting an electric circuit to thereby bypass noise conducting through the flat cable.

Feedthrough capacitors are provided at a substrate, feedthrough terminals to be inserted into the capacitors are held by an insulator, at the upper ends of the feedthrough terminals are provided sharp furcate insulation displacement connection portion, and a cover insulator jig for press-inserting the furcation of each insulation displacement connection portion into the flat cable is provided.

The sharp furcation of each insulation displacement connection portion pierced into the flat cable nips each cable conductor to be electrically conductive and the cover insulator and insulator are fixed by a holding means to keep the cable conductor and insulation displacement connection portion in conductive condition, whereby noise conductive through the flat cable is bypassed by the feedthrough capacitors.

5 Claims, 9 Drawing Figures

NOISE ELIMINATOR

This invention relates to a noise eliminator which is mounted from the exterior to a flat cable used for various digital devices so that normal signals are conducted through the flat cable and noise conductive therethrough is bypassed.

Figure 1:
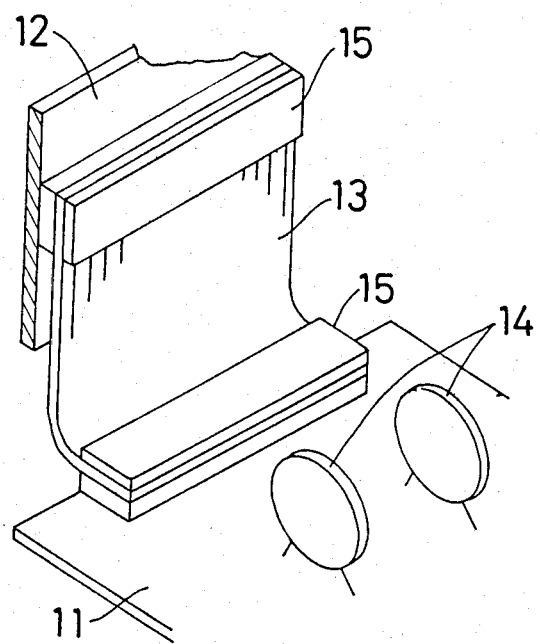

The circuits at the digital device, for example a printed substrate 11 and the outer surface of a frame 12 are connected by a flat cable 13 as shown in FIG. 1, so that noise conductive through the flat cable 13 need be eliminated.

Conventionally, for eliminating the noise conductive through the flat cable 13, parts 14 for noise elimination, as shown in FIG. 1, are usually mounted onto the printed substrate 11, and thereafter connected to the exterior by use of the flat cable 13 through connectors 15, or by use of connectors incorporating therein capacitors.

The former noise elimination, however, may emit as radio wave noise from the exterior because the flat cable 13 between the circuit and the connector acts as an antenna, or receive noise generated in the interior and transmit it to the exterior, which will cause inconvenience of devicing a countermeasure by use of another means in combination, such as a shield of flat cable. Also, when a problem is created after the circuit has been completed, a design change is required to newly mount noise elimination parts onto the printed substrate.

The latter noise elimination is superior in that noise is shielded at an entrance and exit of apparatus to impede entrance of noise from the exterior to the interior emission of the same vice versa, but it is necessary for connecting the flat cable and connector in solderless joint to connect the connector with each capacitor independently thereof not to attach solder to the insulation displacement connection portion, thereby creating a problem in that the connection work is complex and the connector is not reducible in its manufacturing cost.

The reason for this is that when the connectors and capacitors are intended to connect simultaneously in solder dipping or the like, the insulation displacement connection portion will be attached also with solder.

An object of the invention is to provide a noise eliminator easy to take a countermeasure for noise elimination with respect to the flat cable.

Another object of the invention is to provide a noise eliminator which is easy to connect in solderless joint and free to select the connection position with respect to the flat cable.

Still another object of the invention is to provide a noise eliminator capable of coping with a noise problem without any design change even when the problem is created after completion of products.

A further object of the invention is to provide a noise eliminator easy to take a countermeasure without deteriorating a characteristic of a feedthrough capacitor effective in noise elimination up to a high frequency.

These and other objects and features of the invention will become more apparent upon a reading of the following detailed specification and drawings.

Figure 2:
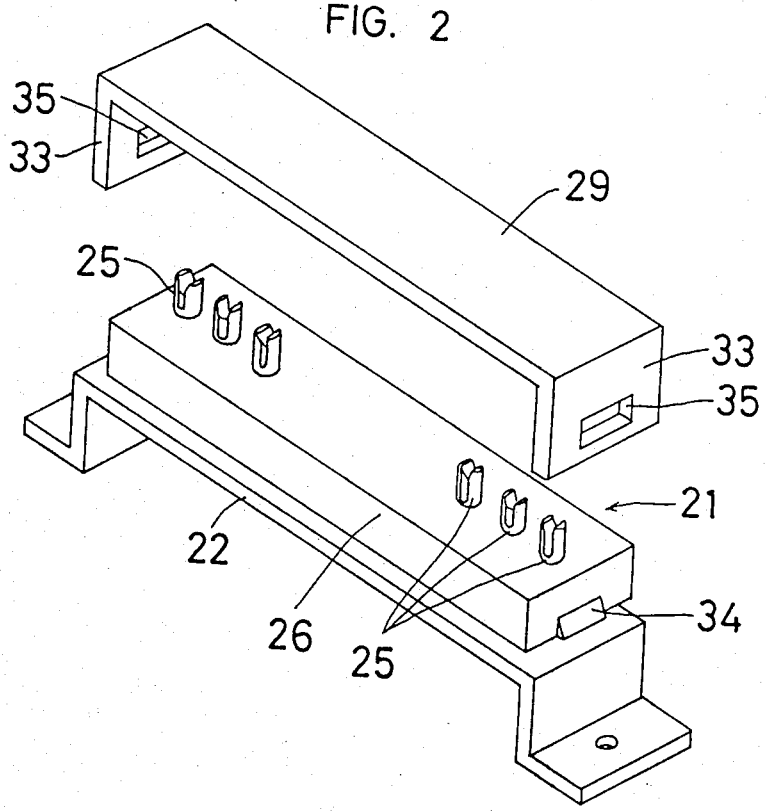
Figure 3:
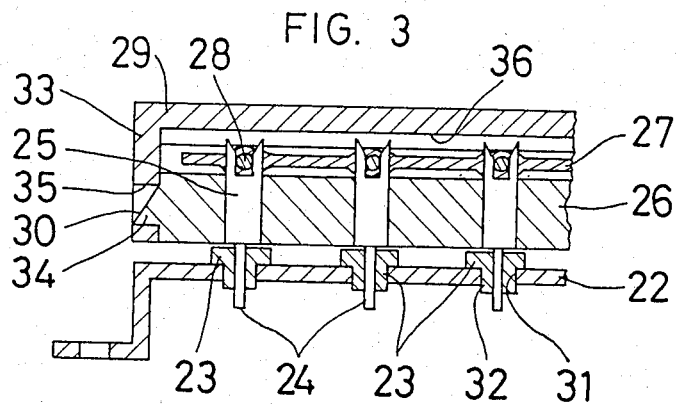
Figure 4:
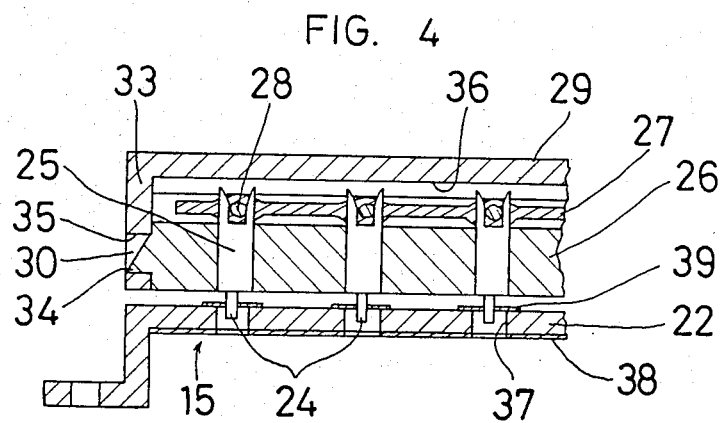
Figure 5:
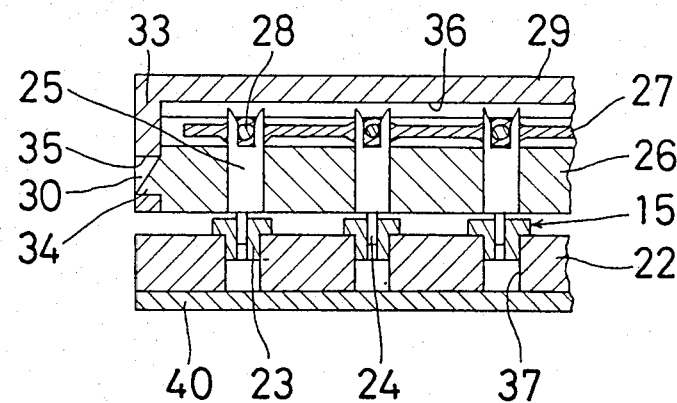
Figure 6:
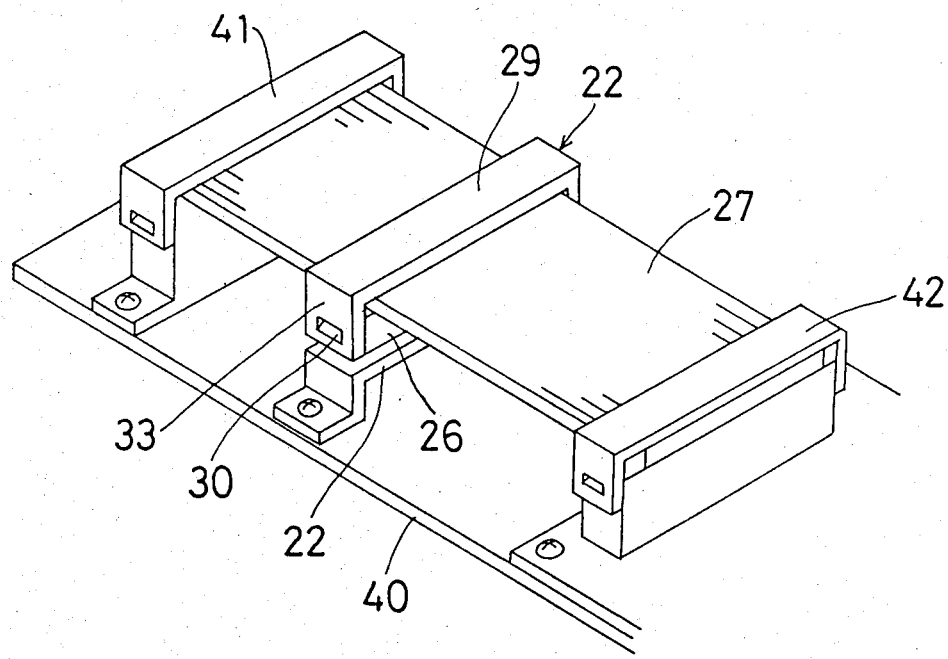
Figure 7:
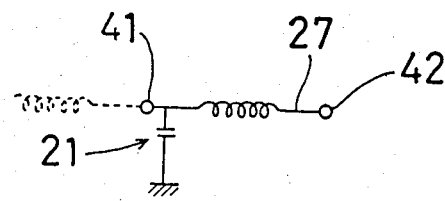
Figure 8:
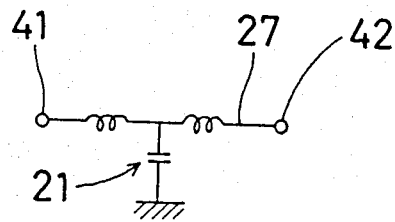
Figure 9:
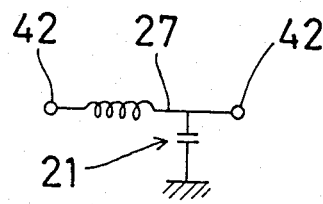

FIG. 1 is a perspective view of a conventional noise elimination means,

FIG. 2 is a perspective exploded view of an embodiment of a noise eliminator of the invention, FIG. 3 is an enlarged sectional view of the FIG. 2 embodiment when in use, FIGS. 4 and 5 are longitudinal sectional views exemplary of different feedthrough capacitors, FIG. 6 is a perspective view thereof when in use, and FIGS. 7, 8 and 9 are circuit diagrams of equivalent circuits changing by the mounting position of the noise eliminator of the invention.

Referring to FIGS. 2 and 3, a noise eliminator 21 of the invention is shown, which comprises a substrate 22 formed of metal plate and for earth, a group of plurality of feedthrough capacitors 23 mounted onto the substrate 22 at regular intervals, feedthrough terminals 24 inserted into the feedthrough capacitors 23 respectively, insulation displacement connection portion 25 provided at the upper ends of feedthrough terminal 24 respectively, an insulating material 26 for disposing the insulation displacement connection portion 25 at intervals the same as those for feedthrough capacitors 23, and a cover insulator 29 which allows the feedthrough terminals 24 to pierce a flat cable 27 to connect cable conductors 28 with the feedthrough terminals 24 respectively.

The feedthrough capacitors 23 group and feedthrough terminals 24 are disposed at intervals the same as pitch of conductors 28 at the flat cable 27, the insulating material 26 and cover insulator 29 being fixed by holding means 30 in a manner of sandwiching the flat cable 27 between the material 26 and the jig 29.

The feedthrough capacitors 23, as shown in FIG. 3, are inserted into through bores 31 provided at the substrate 22 and the exterior electrodes of capacitors 23 are connected by soldering to the substrate 22 and the interior electrodes of the same are connected by soldering to the terminals 24 perforating dielectrics 32 respectively, the solderless joint terminals 25 of sharp furcation at the upper ends being provided at the upper ends of feedthrough terminals 24 respectively.

The cover insulator 29 and insulating material 26 sandwich therebetween the flat cable 27 and the jig 29 urges the cable 27, whereby the furcate portion of each terminal 25 pierces the cable insulating material 26 and is fitted onto the conductor 28, thus electrically connecting therewith.

The holding means 30 for holding the insulating material 26 and jig 29, comprise bent portions 33 extending downwardly from both lengthwise ends of the jig 29 and abutting against to both end faces of insulating material 26, engaging projections 34 each provided at the fitting surface of one of bent portion 33 and end face of insulating materials 26, and engaging recesses 35 provided at the other and engageable with the projection 34. When the jig 29 is pressed onto the insulating material 26, the projection 34 engage with the recesses 35 respectively, thereby fixing the flat cable 27 in condition of being sandwiched.

The cover insulator 29 is provided at the inner surface with a groove 36 into which the uppermost ends of furcate portion at each insulation displacement connection portion 25 are housed, so as to push each conductor 28 into the furcate portion in the predetermined depth.

FIGS. 4 and 5 show feedthrough capacitors different in construction.

Referring to FIG. 4, a substrate 22 comprising plate-like dielectric is provided with through bores 37 spaced at intervals the same as those for conductors 28 at the flat cable 27, a common earth electrode 38 is provided at the rear of substrate 22, and electrodes 39 are provided on the surface of the same at the positions corresponding to the through bores 37, the feedthrough terminals 24 being mounted electric-conductively to the electrodes 39 respectively, the earth electrode 38 being connectable directly to a chassis or the like.

The feedthrough capacitor in FIG. 5 is fundamentally similar to that in FIG. 3, but the substrate 22 is larger in thickness and the dielectric 32 is embedded in the substrate 22 for earth so as to lower earth impedance.

FIG. 6 shows an example of connection of the noise eliminator of the invention with the flat cable 27, in which the noise eliminator is mounted to an intermediate portion of flat cable 27 connecting the wiring on a printed substrate 40 with the exterior of frame through solderless joint type connectors 41 and 42, thereby escaping noise conductive on the cable 27, to the chassis 40.

The noise eliminator 21 of the invention need only be connected with the conductors 28 at the flat cable 27 in such a manner that the insulating material 26 and cover insulator 29 sandwich therebetween the cable 27 and the cover insulator 29 is urged to allow the feedthrough terminals 25 to pierce the cable insulator. Also, the noise eliminator 21 can desirably select its mounting position with respect to the flat cable 27 corresponding to input-output impedance. Namely, in FIG. 7, the noise eliminator 21 is mounted in the vicinity of an external connector 41 to form an equivalent circuit, in FIG. 8 the same to an intermediate portion of flat cable 27 to form a T-type equivalent circuit, and in FIG. 9 the same is mounted in proximity to the printed substrate to form the equivalent circuit.

Thus, the noise eliminator of the invention can be connected on the way of the flat cable by the solderless joint method to thereby take the countermeasure for noise elimination with easy without deteriorating the characteristic of feedthrough capacitor effective in noise elimination up to the high frequency. Also, even when a noise problem is created after completion of products, the countermeasure for noise elimination can be taken without design change, in turn remodeling of the printed substrated and the noise eliminator is easy to mount.

Furthermore, the noise eliminator is mountable to a desired position on the flat cable, thereby being mounted in proximity to the connector so as to obtain the same effect as the connector containing the capacitor, and at an intermediate portion of cable so as to serve as a T-type filter utilizing inductance of cable, thus obtaining further larger noise elimination effect. Hence, the countermeasure corresponding to the input-output impedance can be taken so that the noise elimination of the invention can obtain the largest effect by use of the smallest number of parts.

While a preferred embodiment has been described, variations thereto will occur to those skilled in the art within the scope of the present inventive concepts which are delineated by the following claims.

What is claimed is:

1. A noise eliminator characterized by comprising a substrate provided with feedthrough capacitors, feedthrough terminals inserted into said feedthrough capacitors respectively, insulation displacement connection portion which have sharp furcate portions and are provided at the upper ends of said feedthrough terminals respectively, an insulating member holding said insulation displacement connection portion spaced at intervals coincident with those between said feedthrough capacitors disposed, and a cover insulator for press-fitting the furcate portions at said insulation displacement connection portion into a flat cable, so that said cover insulator is adapted to be fixed to said insulating member by holding means.

2. A noise eliminator according to claim 1, wherein said feedthrough capacitors are inserted into through bores provided at said substrate and connect the external electrodes of said capacitors by soldering to said substrate and connect the internal electrodes by soldering to terminals perforating a dielectric.

3. A noise eliminator according to claim 2, wherein said feedthrough capacitors are so constructed that said substrate is made larger in thickness and said dielectric is embedded into said substrate so that earth impedance is made low.

4. A noise eliminator according to claim 1, wherein said feedthrough capacitors are so constructed that said substrate using said dielectric is provided with through bores, and is provided at the rear surface thereof with a common earth electrode, and at the positions of through bores on the surface of said substrate with electrodes respectively.

5. A noise eliminator according to claim 1, wherein said holding means connecting said insulating member with said cover insulator each comprise an engaging projection provided at the fitting surface of one of said insulating member and cover insulator and an engaging recess provided at the other end engageable with said projection.

* * * * *